(12) United States Patent
Kamigaichi et al.

(10) Patent No.: US 7,616,491 B2
(45) Date of Patent: Nov. 10, 2009

(54) SEMICONDUCTOR MEMORY DEVICE IMPROVED IN DATA WRITING

(75) Inventors: Takeshi Kamigaichi, Yokohama (JP); Riichiro Shirota, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 18 days.

(21) Appl. No.: 11/738,636

(22) Filed: Apr. 23, 2007

(65) Prior Publication Data

US 2007/0247912 A1 Oct. 25, 2007

(30) Foreign Application Priority Data

Apr. 24, 2006 (JP) .............................. 2006-119612

(51) Int. Cl.
*G11C 16/04* (2006.01)
(52) U.S. Cl. .............................. 365/185.17; 365/185.05; 365/185.27
(58) Field of Classification Search ............ 365/185.05, 365/185.17, 185.27
See application file for complete search history.

(56) References Cited

U.S. PATENT DOCUMENTS

| | | | |
|---|---|---|---|
| 5,579,260 A * | 11/1996 | Iwahashi ................ | 365/185.24 |
| 6,151,249 A | 11/2000 | Shirota et al. | |
| 6,762,955 B2 * | 7/2004 | Sakui et al. ............ | 365/185.05 |
| 7,411,825 B2 | 8/2008 | Kutsukake et al. | |
| 2005/0047210 A1 * | 3/2005 | Matsunaga et al. ..... | 365/185.17 |

FOREIGN PATENT DOCUMENTS

| | | |
|---|---|---|
| JP | 8-64699 | 3/1996 |
| JP | 8-115987 | 5/1996 |
| JP | 2002-324400 | 11/2002 |

OTHER PUBLICATIONS

Allen et al., CMOS Analog Circuit Design, 1987, Saunders College Publishing, pp. 54, 98, 102.*
Allen et al., CMOS Analog Circuit Design, 1987, Saunders College Publishing, all pages, in particular 51-54, 98, 102.*

* cited by examiner

*Primary Examiner*—Huan Hoang
*Assistant Examiner*—Fernando N Hidalgo
(74) *Attorney, Agent, or Firm*—Oblon, Spivak, McClelland, Maier & Neustadt, L.L.P.

(57) ABSTRACT

A bit line is shared by first and second NAND units. First and second selection transistors are connected in series between the bit line and the first NAND unit. Third and fourth selection transistors are connected in series between the bit line and the second NAND unit. A control unit changes a first and second signals and a potential of the bit line from a first level to a second level higher than a first level, and changes the potential of the bit line from the second level to the first level after changing the first signal from the second level to the first level.

15 Claims, 8 Drawing Sheets

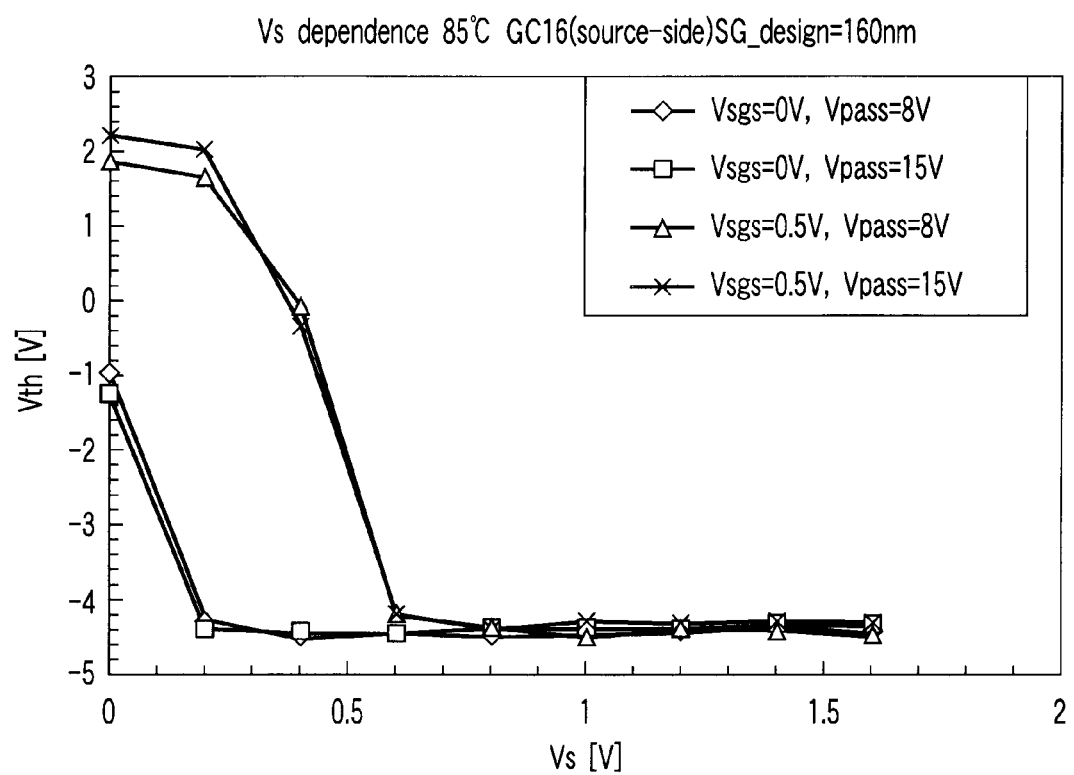
F I G. 10

SEMICONDUCTOR MEMORY DEVICE IMPROVED IN DATA WRITING

CROSS-REFERENCE TO RELATED APPLICATIONS

This application is based upon and claims the benefit of priority from prior Japanese Patent Application No. 2006-119612, filed Apr. 24, 2006, the entire contents of which are incorporated herein by reference.

BACKGROUND OF THE INVENTION

1. Field of the Invention

The present invention relates to a semiconductor memory device, for example, a NAND-type flash memory.

2. Description of the Related Art

A NAND-type flash memory (for example, Jpn. Pat. Appln. KOKAI Publication No. 2002-324400, Jpn. Pat. Appln. KOKAI Publication No. 8-64699, and Jpn. Pat. Appln. KOKAI Publication No. 8-115987) has been known as one of nonvolatile semiconductor memory devices.

In the NAND-type flash memory, a plurality of serially connected EEPROM cells comprise, for instance, a NAND unit. A source side of the NAND unit is connected to a source line through a first selection gate, and a drain side is connected to a bit line through a second selection gate. A diffusion layer of the second selection gate and the bit line are connected to each other through a bit line contact.

The bit line contact is formed as below. A first and a second selection gates and word lines are formed firstly. After this, control gate electrodes as word lines are silicided. Insulating films are deposited between word lines. Bit line contacts then formed through a generic contact forming technique, such as a lithography process, an etching process, a depositing process of metallic films, and a planarizing process.

Electrode member as the bit line contacts are embedded in bit line contact holes. However, recently, as fineness in an element is promoted, mutual intervals between adjacent bit lines become narrower. Therefore, it has become hard to form fine contact holes and to embed the electrode members in the contact holes, and the connections between the bit line contacts and the diffusion layers of the second selection gates become defective. Therefore, poor connections possibly occur.

Enlarging the diameters of the contact holes is a possible approach to prevent the poor connections of the bit line contacts. However, in this case, the adjacent bit line contacts make contact with each other, and results in generation of short circuit of the NAND units.

Accordingly, a semiconductor memory device which facilitates the forming of the bit line contacts, and allows writing therein with sure has been desired.

BRIEF SUMMARY OF THE INVENTION

According to a first aspect of the invention, there is provided a semiconductor memory device comprising: first and second NAND units in which a plurality of memory cells are arranged in a row and a column, and the plurality of memory cells arranged in the column is connected in series; a first bit line shared by the first and second NAND units; first and second selection transistors connected in series between the first bit line and the first NAND unit, wherein the first selection transistor has a first threshold voltage and a first signal is supplied to its gate, and the second selection transistor has a second threshold voltage higher than the first threshold voltage and a second signal is supplied to its gate; third and fourth selection transistors connected in series between the first bit line and the second NAND unit, wherein the third selection transistor has the second threshold voltage, and the first signal is supplied to its gate, and the fourth selection transistor has the first threshold voltage, and the second signal is supplied to its gate; and a control unit which changes the first and the second signals and a potential of the first bit line from a first level to a second level higher than the first level in writing data into a memory cell of the first NAND unit, and changes the potential of the first bit line from the second level to the first level after changing the first signal from the second level to the first level.

According to a second aspect of the invention, there is provided a semiconductor memory device comprising: a plurality of NAND units which are arranged in a row direction, and each of the NAND units has a plurality of memory cells connected in series; a bit line selectively connected to a pair of adjacent NAND units among the plurality of NAND units; first and second selection transistors connected in series between the bit line and one of the pair of NAND units, wherein a first signal is supplied to the gate of the first selection transistor, a second signal is supplied to the gate of the second selection transistor, and the third selection transistor has a threshold voltage higher than the fourth selection transistor; and a control unit which changes the first and the second signals and a potential of the first bit line from a first level to a second level higher than the first level in writing data into a memory cell of one NAND unit, and changes the potential of the first bit line from the second level to the first level after changing the first signal from the second level to the first level.

According to a third aspect of the invention, there is provided a data writing method comprising: setting a first signal to a second level higher than a first level, turning on a first depletion-type selection transistor which is connected in series between a bit line and a first NAND unit among the first selection transistor and an enhancement-type second selection transistor, further turning on an enhancement-type third selection transistor which is connected in series between the bit line and a second NAND unit among the third selection transistor and a depletion-type fourth selection transistor, and turning on the second and the fourth selection transistors by setting a second signal to the second level to charge the first and the second NAND units by the potential of the bit line; lowering the potential of the bit line after changing the first signal from the second level to the first level to discharge the first NAND unit through the first and second selection transistors being in on states; and supplying a write voltage to a selected word line, supplying a third level higher than the second level and lower than the write voltage to an unselected word line, and writing data into a selected memory cell of the first NAND unit.

BRIEF DESCRIPTION OF THE SEVERAL VIEWS OF THE DRAWING

FIG. 10 is a characteristic view showing an off characteristic of an enhancement-type transistor;

DETAILED DESCRIPTION OF THE INVENTION

Hereinafter, embodiments of the present invention will be described with reference to the drawings.

Figure 1:
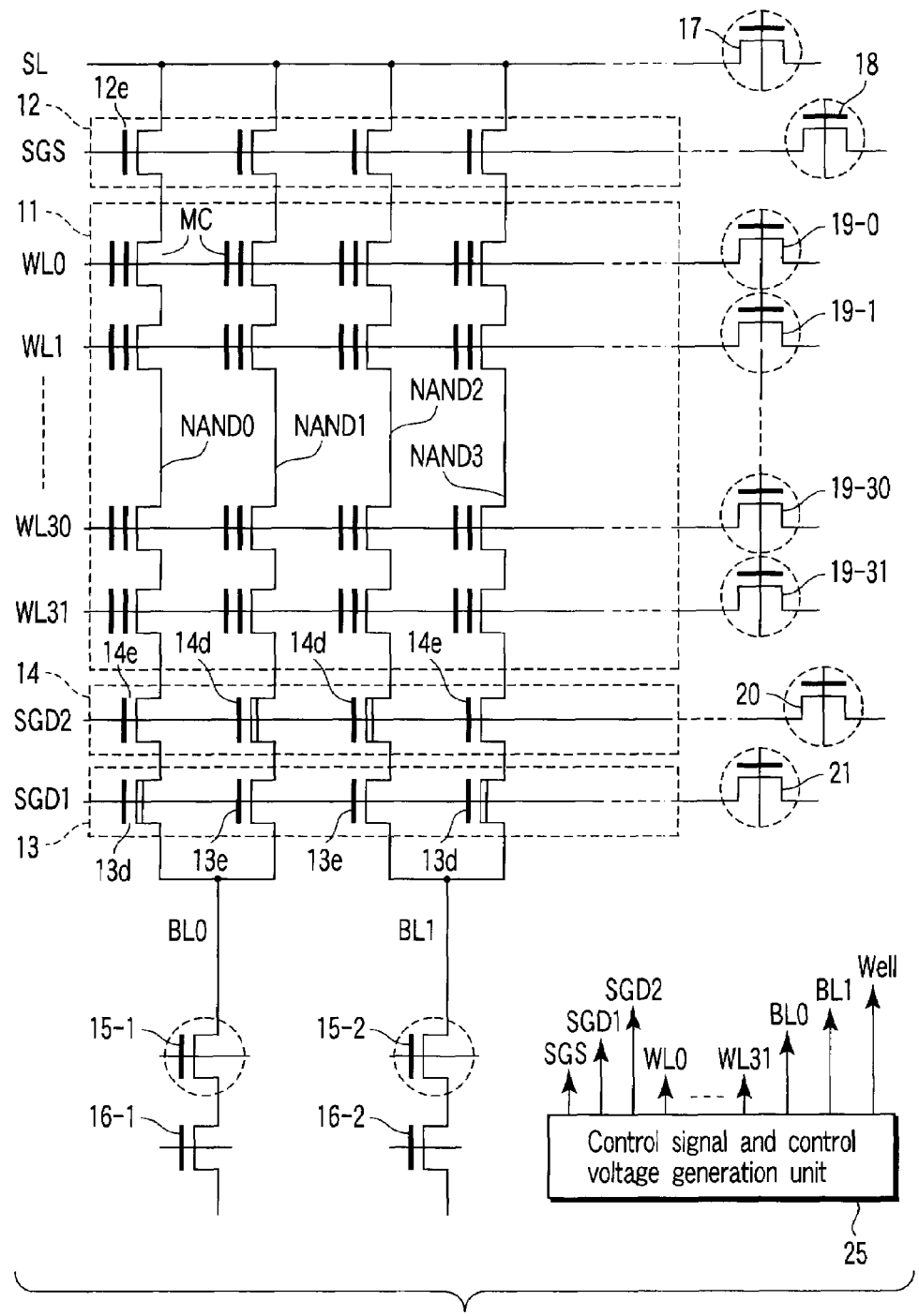
FIG. 1 is a circuit diagram showing a semiconductor memory device of an embodiment of the invention.

FIG. 1 illustrates a semiconductor memory device of the embodiment of the invention. In a cell transistor array 11, a plurality of memory cells MCs constituting of EEPROM cells are each arranged in rows and columns. The plurality of memory cells arranged in columns are connected in series, and compose NAND cell units NAND0 to NAND3, respectively. In memory cells arranged in each row, control gates are connected to word lines WL0, WL1-WL30, and WL31, respectively. A source side of each NAND unit is connected to a source line SL through a source line selection gate array 12. The source line selection gate array 12 constitutes a plurality of enhancement type transistors 12e. A signal SGS is supplied to each gate electrode of the transistors 12e.

First and second drain selection gate arrays 13, 14 which are connected in series from the bit line side are connected between the drain side of each NAND unit and bit lines BL0 and BL1. The first and second drain selection gate arrays 13 and 14 are constituted by a plurality of enhancement-type transistors 13e and 14e and a plurality of depletion-type transistors 13d and 14d, respectively. Threshold voltages of the depletion-type transistors 13d and 14d are set lower than those of the enhancement-type transistors 13e and 14e. The transistors of the first and the second drain selection gate arrays 13 and 14 are constituted by enhancement-type transistors and depletion-type transistor which are connected in series. In the adjacent NAND units connected to a shared bit line, the enhancement-type transistors 13e and 14e and the depletion-type transistors 13d and 14d are connected mutually and by turns. That is, the depletion-type transistor 13d and the enhancement-type transistor 14e are connected in series between a bit line BL0 and a NAND unit NAND0, and the enhancement-type transistor 13e and the depletion-type transistor 14d are connected in series between a bit line BL0 and a NAND unit NAND1.

The enhancement-type transistor 13e and the depletion-type transistor 14d are connected in series between a bit line BL1 and a NAND unit NAND2 in the same manner as that of the NAND unit NAND1, and the depletion-type transistor 13d and the enhancement-type transistor 14e are connected in series between the bit line BL1 and a NAND unit NAND3 in the same manner as that of the NAND unit NAND0.

Like this, making the types of the transistors adjacent to the word line direction even facilitates manufacturing a mask pattern to introduce impurities into the channel regions of the transistors. A signal SGD1 is supplied to the gate electrodes of the transistors 13d and 13e composing the first drain selection gate array 13, and a signal SGD2 is supplied to the gate electrodes of the transistors 14d and 14e.

Transistors 15-1, 15-2, 16-1 and 16-2 which connect the bit lines BL0 and BL1 to other circuits (not shown) are connected in series, respectively, to the bit lines BL0 and BL1.

Further, a transistor 17 is connected to the source line SL, and a transistor 18 is connected to the gate electrodes of the transistors 12e composing the source line selection array 12. Word line drive transistors 19-0 to 19-31 are connected to each word line WL0, WL1-WL30, WL31, respectively, and transistors 20 and 21 are connected to the gate electrodes of the transistor 13e, 13d, 14e and 14d composing the first and the second drain side selection gate arrays 13 and 14, respectively. These transistors 15-1, 15-2, 17, 18, 19-0 to 19-31, 20 and 21 with the dotted-line circles each marked thereto are composed of each high-voltage resistant transistor having withstand voltage higher than other transistor.

The signals SGS, SGD1, SGD2, and voltages of word lines WL0-WL31, the voltages of the bit line BL0 and BL1, the voltage of the source line SL, and the voltage of the well described below are generated from a control signal and control voltage generation unit 25.

Figure 2:
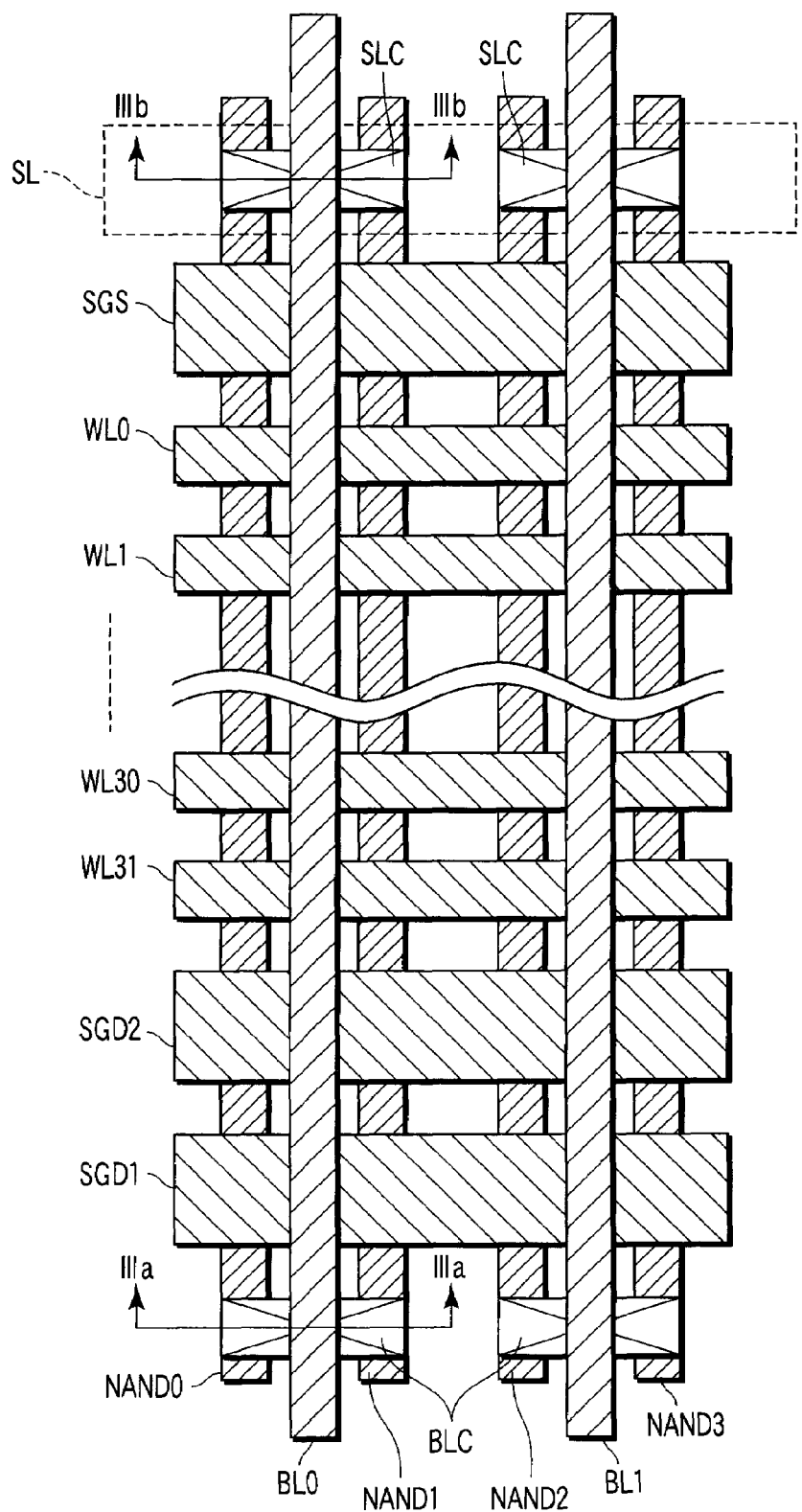
FIG. 2 is a plane view showing a pattern corresponding to the circuit diagram depicted in FIG. 1.
Figure 3A:
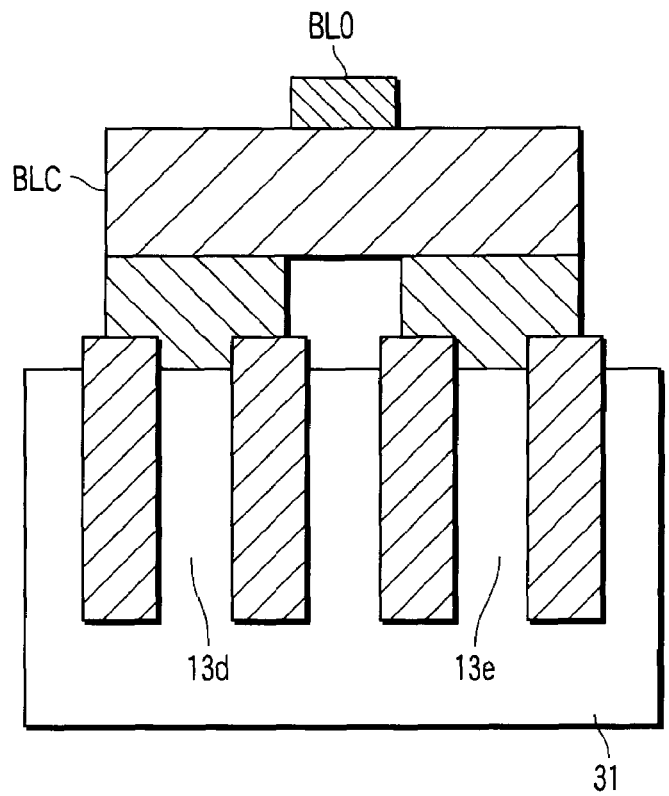
FIG. 3A is a cross-sectional view along IIIa-IIIa of FIG. 2.
Figure 3B:
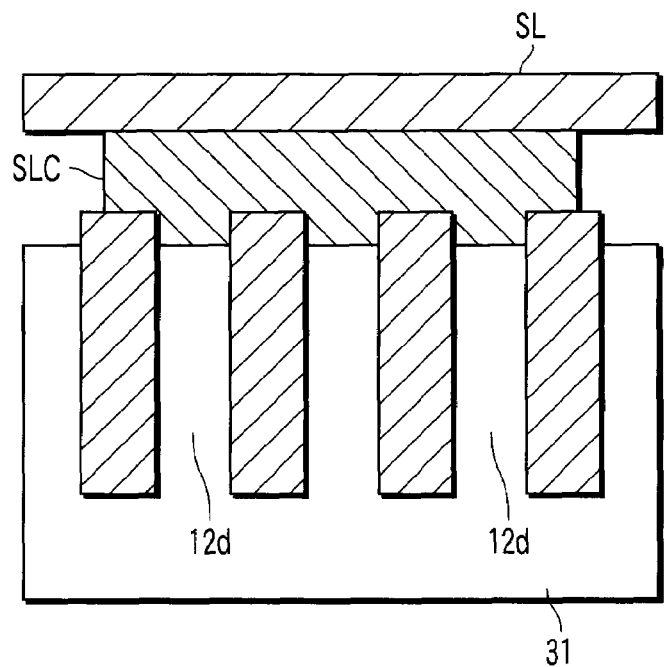
FIG. 3B is a cross-sectional view along IIIb-IIIb of FIG. 2.

FIG. 2 is a plane view showing a pattern corresponding to the circuit shown in FIG. 1, FIG. 3A shows a bit line contact, and FIG. 3B shows a source line contact. In FIGS. 2, 3A and 3B, the same components as those of FIG. 1 are designated by the identical symbol.

In FIGS. 2 and 3A, a bit line contact BLC is set by one for each two adjacent NAND units NAND0 and NAND1 (NAND2, NAND3), each bit line BL0 and BL1 are connected to two NAND units through the bit line contact BLC. In FIGS. 2 and 3B, similar to the bit line contact BLC, one source line SLC is set for each two NAND units NAND0 and NAND1 (NAND2 and NAND3). The source line contact SLC connects the source line SL and the adjacent two NAND units. In FIGS. 3A and 3B, a symbol 31 indicates a well region or a substrate.

Figure 4:
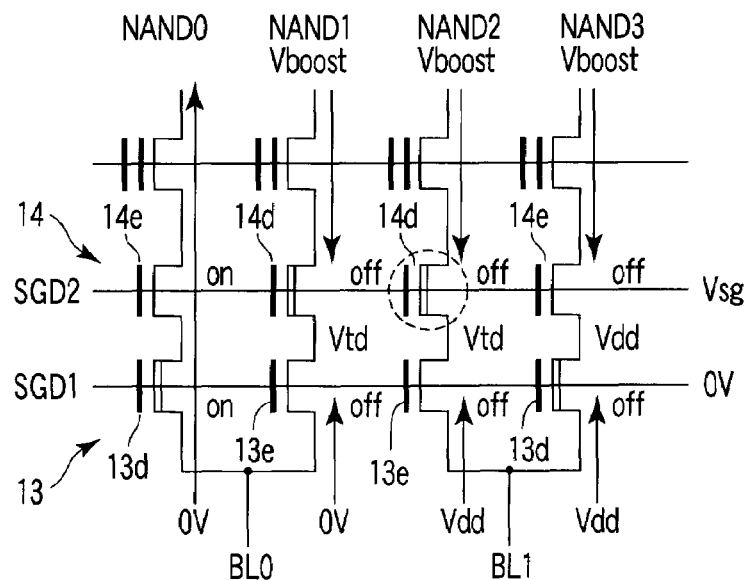
FIG. 4 shows a part of FIG. 1, and is a view showing write operations.
Figure 5:
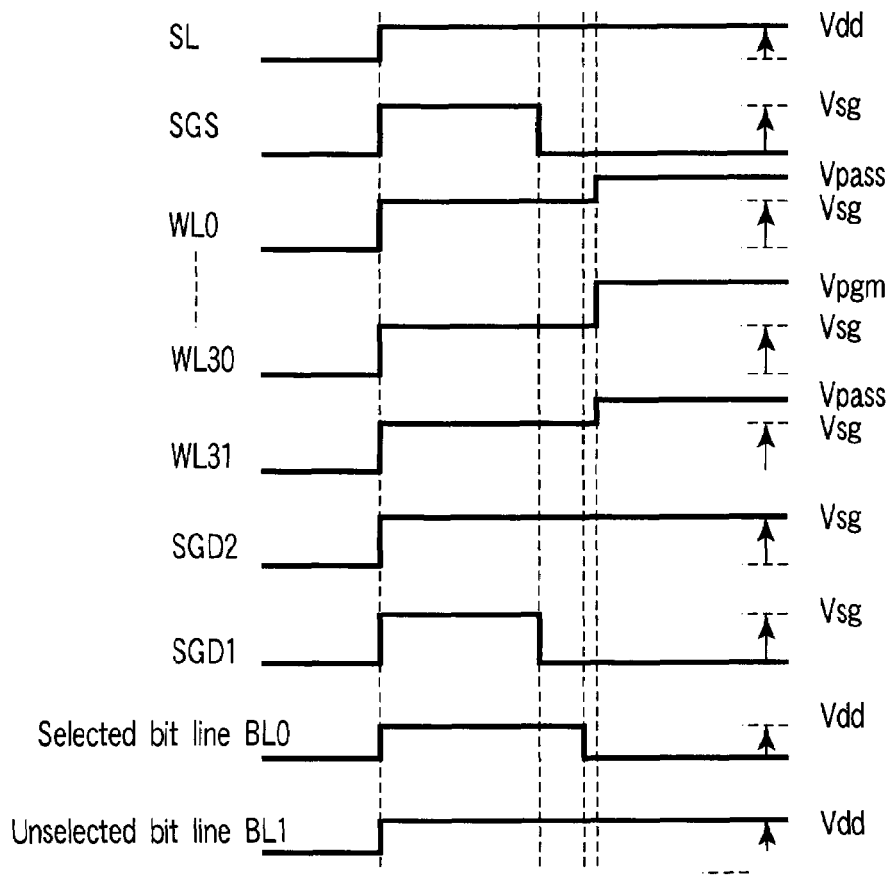
FIG. 5 is a timing chart of the write operations shown in FIG. 4.

Write operations in the aforementioned structure will be described by referring to FIGS. 4 and 5. FIG. 4 indicates a part of FIG. 1, and indicates the case in which the bit line BL0 is selected and the bit line BL1 is not selected. FIG. 5 shows a timing chart in writing.

In the write operation, the semiconductor memory device firstly sets the source line SL to a voltage Vdd, and sets the signals SGD1 and SGD2 to be supplied to the gates of each transistor 12e constitute the source line selection gate array 12 to a voltage Vsg. The voltage Vsg may be a voltage possible to transfer the voltage Vdd applied to the source line SL to each NAND unit, and, for instance, the memory device sets it so as to satisfy a formula $VSG \geq Vdd+Vth$ (Vth is a threshold voltage of an enhancement-type n-channel MOS transistor).

For instance, the voltage Vsg is applied to all the world lines WL0-WL31. Moreover, the voltage Vdd is applied to all the bit lines BL0 and BL1, the signals SGD1 and SGD2 to be applied to the gates of the transistors constitute the first and the second drain selection gate arrays 13 and 14 are set to the voltage Vsg. Like this, the source line SL and the bit line BL0 and BL1 transfer the voltage Vdd to each NAND unit.

The memory device applies the voltage Vsg to the whole of the word lines WL0-WL31, however; it does not always need to apply the voltage Vsg, and it may apply a potential possible to transfer the potential of the bit line. The reason the memory device has set the signal SGS to the voltage Vsg before writing is to prevent erroneous writing of the unselected NAND unit, and, for instance, to surely charge the channel unit of the NAND unit to the voltage Vdd at first. That is, the memory device becomes possible to surely transfer the voltage to the channel including the diffusion layer between the first and the second drain line selection gate arrays 13 and 14 by turning on the transistors 12e constitute the source line selection gate array 12 through the signal SGS.

After each NAND unit is fully charged to the voltage Vdd, the signal SGS of the source selection gate array 12 and the signal SGD1 to be supplied to the gates of the first drain selection gate array 13 are lowered to 0 V. Thereby, the source line selection gate array 12 is brought into a cutoff state. On the other hand, in the first drain selection gate array 13, the enhancement-type transistor 13e is tuned off, but the depletion-type transistor 13d is still in an on state.

After this, when the selected bit line BL0 is lowered to 0 V, the NAND unit is discharged down to 0V. However, the NAND unit NAND1 to be connected to the selected bit line BL0 is not discharged because the transistors 13e and 14d have been tuned off. Similarly, the NAND units NAND2 and NAND3 connected to the unselected bit line BL1 are not discharged because the transistors 13e, 13d, 14d and 14e has been turned off.

Next, after the channel of the NAND unit NAND0 including a writing cell is sufficiently discharged, for example, a voltage Vpass is applied to unselected word lines WL0-WL29 and WL31, and a program voltage Vpgm (>Vpass) is applied to a selected word line WL30. Unselected cells of each of the NAND units are boosted to the voltage Vpss applied to the word lines to prevent the erroneous writing. The selected cell of the NAND unit NAND0 is boosted by the program voltage Vpgm, and writing is performed therein.

Figure 6:
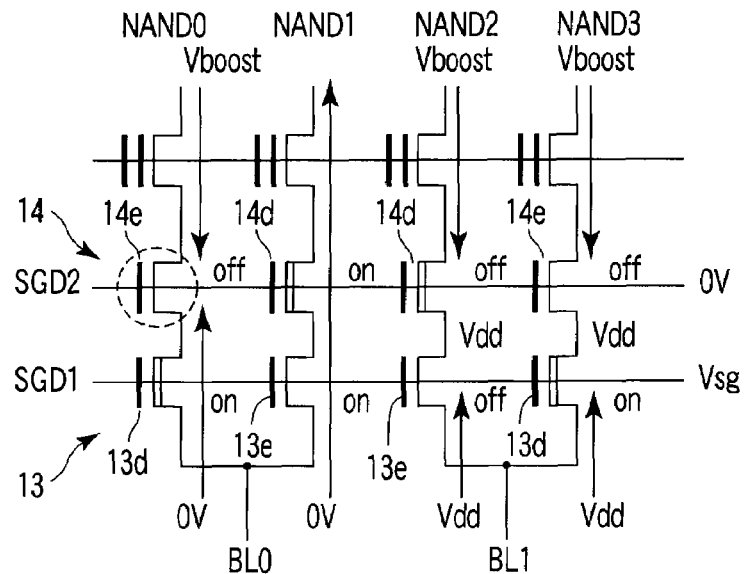
FIG. 6 shows a part of FIG. 1, and is a view showing operations differing from those of FIG. 4.
Figure 7:
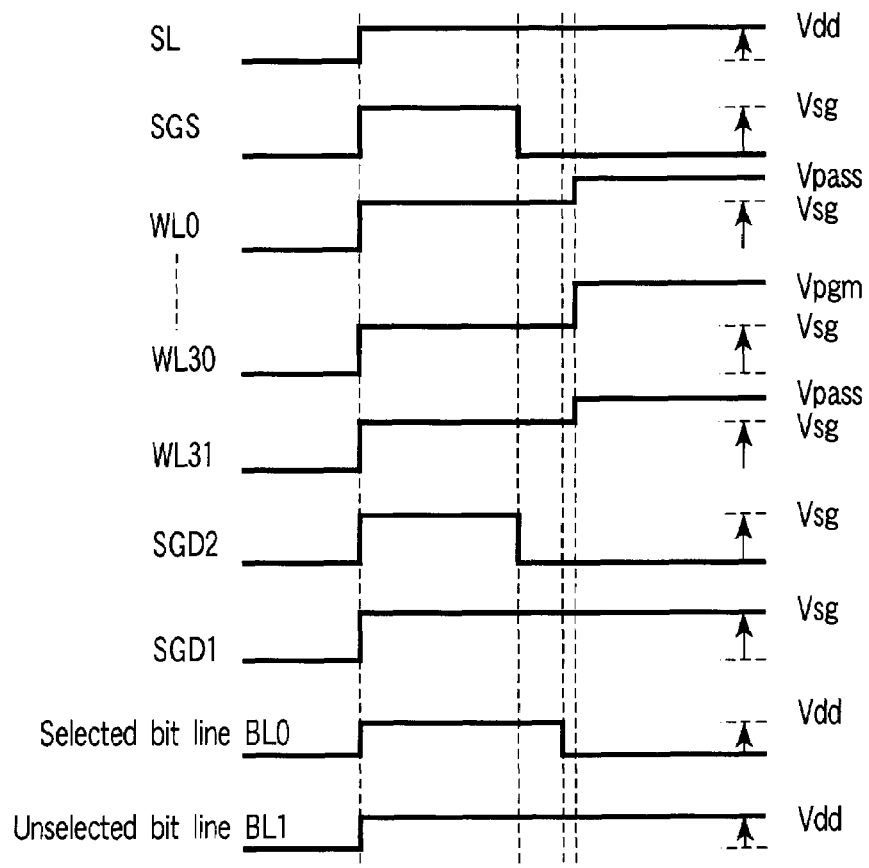
FIG. 7 is a timing chart of operations shown in FIG. 6.

FIGS. 6 and 7 shows the operations in the cases in which the writing cell is in the NAND unit NAND1. In FIGS. 6 and 7, the same components as those in FIGS. 4 and 5 are designated by identical symbols.

FIGS. 6 and 7 are different form FIGS. 4 and 5 in voltage applying sequences of the signal SGD1 and the signal SGD2. That is, after charging each NAND unit NAND0-3 from the source line SL and, bit line BL0 and BL1, the signal SGS to be supplied to the gate electrode of the source selection gate array 12, and the signal SGD2 to be supplied to the gate electrode of the source selection gate array 14 are lowered to 0 V. Thereby, the source selection gate array 12 is turned off, and the enhancement-type transistors 14e composing the second drain gate array 14 are turned off. However, the depletion-type transistors 14d constitute the second drain selection gate array 14 are kept on states. Then, when the selected bit line BL0 is lowered to 0 V, the NAND unit NAND1 is discharged via the transistors 14d and 13e. At the timing when the NAND unit NAND1 has been sufficiently discharged, for example, the voltage Vpass is applied to the unselected word lines WL0-WL29 and WL31, and then, for instance, the program voltage Vpgm is applied to the selected word line WL30. Like this, the memory device performs the writing into the selected cell of the NAND unit NADN1.

In performing the foregoing writing shown in FIGS. 4 and 5, in an unselected NAND unit, the channel region of the memory cell is boosted to a high voltage by the voltage Vpass. Therefore, high voltages are applied to the diffusion layers of the depletion-type transistors 14d composing the second drain selection gate array 14 connected to the unselected bit line (voltage Vdd), namely, to the depletion-type transistors 14d (transistors indicated with circles of dotted lines in FIG. 4) connected to the NAND2. Off characteristic of each transistor 14d is deteriorated, when the gate voltage SGD2 is Vsg, the drain voltage is Vboost, the source voltage Vs is Vtd (Vtd is a voltage transferred to the source of the transistor 14d when the gate voltage SGD2 is Vsg, and the drain voltage is Vboost), and the voltage of the well region 31 is 0 V. Therefore, it is needed to surely turn off the transistors.

Figure 8:
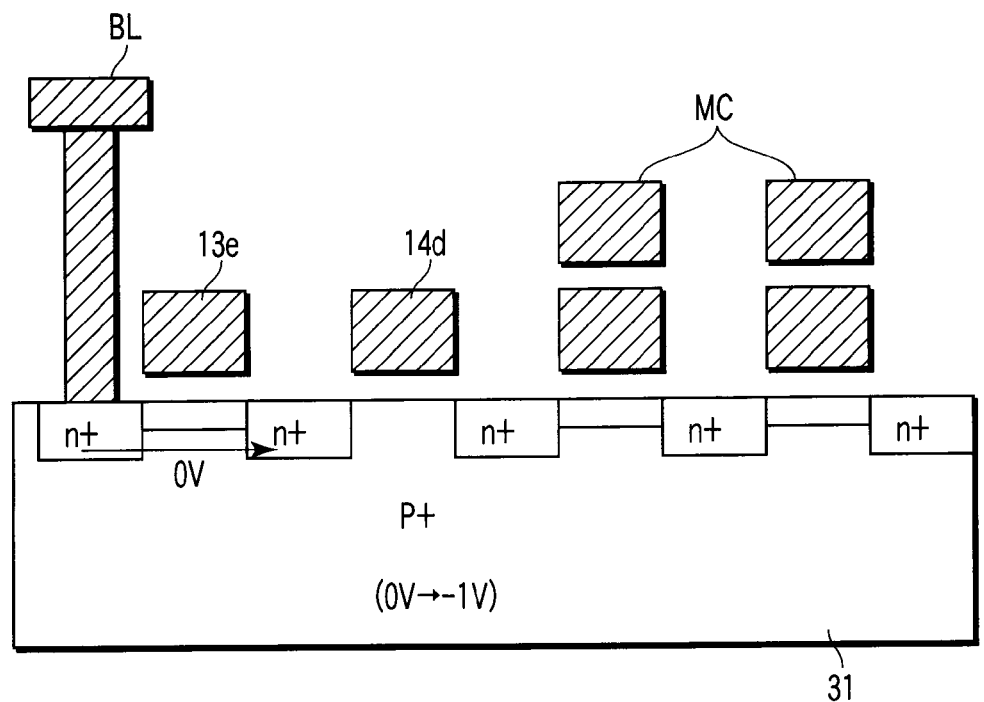
FIG. 8 is a view showing a modified example of the write operations depicted in FIG. 4.
Figure 11:
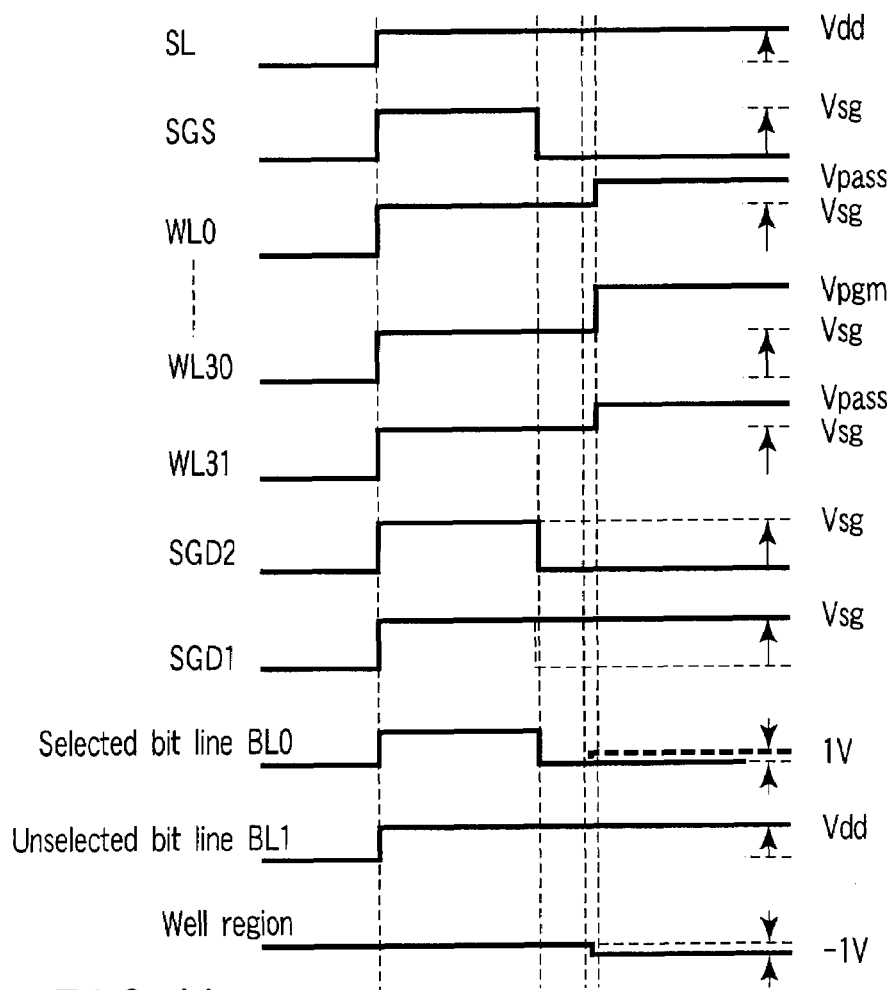
FIG. 11 is a timing chart showing operations corresponding to structures depicted in FIGS. 8 and 9.

FIG. 8 illustrates an example to certainly turn off the depletion-type transistor 14d. In this case, the substrate, or the well region is applied a negative bias, for example, −1 V. The timing applying the negative bias to the well region 31 is, as shown in FIG. 11 with a full line, based on the timing of after discharging the selected bit line BL0, and of before applying the voltage Vpass to the unselected word line. Such a structure improves the off characteristic of the depletion-type transistor 14d which connects the selected bit line and the unselected NAND unit.

In performing the writing shown in FIGS. 6 and 7, in the second drain selection gate array 14, the off characteristic of the enhancement-type transistor 14e (shown in FIG. 6 with dotted-line circle) connected to the NAND unit NAND0 is deteriorated when the gate voltage SGD2 is 0 V, the drain voltage is Vboost, the source voltage Vs is 0 V, and the voltage of the well region is 0 V. The memory device therefore has to surely turn off the enhancement-type transistor 14e.

Figure 9:
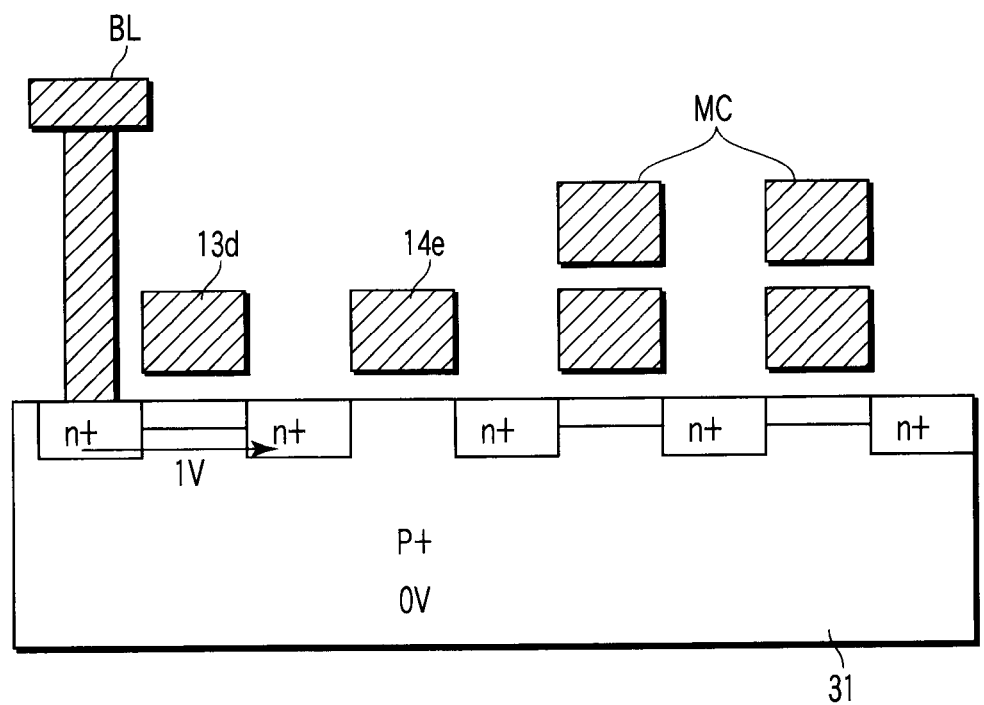
FIG. 9 is a view showing a modified example of the write operations depicted in FIG. 6.

FIG. 9 depicts an example to certainly turn off the enhancement-type transistor 14e. In this case, the memory device is configured so as not to lower the source voltage Vs of the enhancement-type transistor 14e down to 0 V. More specifically, as shown in FIG. 11 with a dotted-line, after the discharge of the selected bit line BL0 is completed and before the voltage Vpass is supplied to the unselected word line, the voltage of, for example, approximately 1 V is applied to the selected bit line BL0.

FIG. 10 shows the off characteristic of the enhancement-type transistor 14e to the source voltage Vs. As cleared from FIG. 10, the transistor 14e will be improved in off characteristic if the source voltage Vs is set to 0.6V or more. Adopting such a structure to apply the voltage of, for example, approximately 1 V to the selected bit line BL0 makes it possible to surely turn off the transistor 14e.

The on condition and the off condition of the enhancement-type transistors 13e and 14e, and the depletion-type transistors 13d and 14d, in the case in which the threshold voltage of the enhancement-type transistors 13e and 14e are set to Vthe, and the threshold voltage of the depletion-type transistors 13d and 14d are set to Vthd, are as follows:

The off condition of the enhancement-type transistors 13e and 14e is expressed by the following formula.

$-Vbit < Vthe(Vb=-Vbit)$

The on condition of the enhancement-type transistors 13e and 14e is expressed by the following formula.

$Vthe(Vb=-Vbit) < Vsg-Vbit$

The off condition of the depletion-type transistors 13d and 14d is expressed by the following formula.

$Vsg-Vtd < Vthd(Vb=Vtd)$

The on condition of the depletion-type transistors 13d and 14d is expressed by the following formula.

$Vthd(Vb=Vtd) < -Vbit$

Here, if the voltage Vbit of the bit line is made, for example, 1 V, the Vsg is made 4 V, the Vdd is made 2.5 V, and the Vt is made 4 V, the specific voltages of the threshold voltages Vthe and Vthd of the enhancement-type transistor and the depletion-type transistor are expressed as follows:

$-1 V < Vthe < 3 V(Vb=-1 V)$ $Vthd < -1 V(Vb=-1 V), 0 V < Vthd(Vb=-4 V)$

According to the embodiment, a single bit line contact is prepared for the adjacent two NAND units. Therefore, the interval of the bit line contacts may be made wider than that of the conventional one. Accordingly, in embedding a conductive member into a contact hole, the memory device may prevent a contact failure. In addition, the interval between the bit line contacts being wider than that of the conventional one, contact of mutual bit line contacts may be prevented.

The enhancement-type transistor and the depletion-type transistor differing from each other in threshold voltage are connected in series among each NAND unit and the bit line. Thereby, the memory device may selectively connect the NAND unit to one bit line.

Further, the memory device applies a negative voltage to the well regions when turning off the depletion-type transistors 14d comprising the second drain selection gate array 14, and applies a voltage approximately 1 V without setting the bit line to 0 V when turning off the enhancement-type transistors 14e. Thereby, the memory device can surely turn off the depletion-type transistors 14d and the enhancement-type transistors 14e comprising the second drain selection gate array 14.

In the embodiment, the first and second drain selection gate arrays 13 and 14, as shown in FIG. 6, have been arranged in a manner in which the mutual enhancement-type transistors and the mutual depletion-type transistors are adjacent two by two in each selection gate array, the present invention is not limited to such a structure.

In the case depicted in FIG. 6, when the signals SGD1 and SGD2 are set to a high level and a low level alternately, two cases in which the adjacent NAND units are selected and not selected, respectively, or selected and selected, respectively, occur. Therefore, the threshold voltages vary sometimes due to the coupling of inter-cell capacities of the adjacent NAND units.

Figure 12:
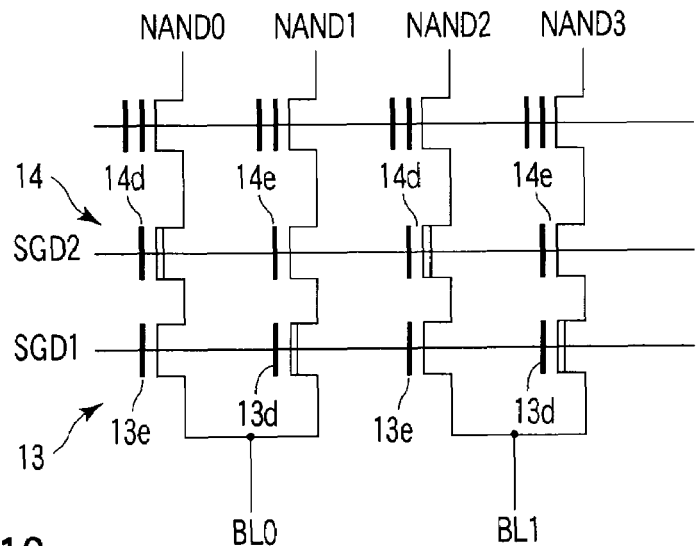
FIG. 12 is a circuit diagram showing a modified example of FIG. 6.

In contrast, FIG. 12 shows the modified example of the structure shown in FIG. 6, and shows the case in which the enhancement-type transistors 13e and 14e, and the depletion-type transistors 13d and 14d are arranged one after the other. In such a structure, if the signals SGD1 and SGD2 are set to the high level and the low level alternately, the adjacent NAND units are brought into the unselected and the selected states alternately, and the adjacent NAND units are not selected with each other at the same time. Therefore, the coupling of the inter-cell capacities of the adjacent NAND units may suppress the fluctuation of the threshold voltages.

In the aforementioned embodiment, the circuit operation shown in FIG. 8 having been described for the circuit operations shown in FIGS. 4 and 5, and the circuit operation shown in FIG. 9 having been described for the circuit operations shown in FIGS. 6 and 7. However, the present invention is not limited to the embodiment, and the combination of the circuit operations depicted in FIGS. 4 and 5 and the circuit operation depicted in FIG. 9, and the combination of the circuit operations shown in FIGS. 6 and 7 and the circuit operation shown in FIG. 8 are effective approach.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
first and second NAND units in which a plurality of memory cells are arranged in a row and a column, and the plurality of memory cells arranged in the column is connected in series;
a first bit line shared by the first and second NAND units;
first and second selection transistors connected in series between the first bit line and the first NAND unit, wherein the first selection transistor has a first threshold voltage and a first signal is supplied to its gate, and the second selection transistor has a second threshold voltage higher than the first threshold voltage and a second signal is supplied to its gate;
third and fourth selection transistors connected in series between the first bit line and the second NAND unit, wherein the third selection transistor has the second threshold voltage, and the first signal is supplied to its gate, and the fourth selection transistor has the first threshold voltage, and the second signal is supplied to its gate; and
a control unit which changes a voltage potential of the first and the second signals and a voltage potential of the first bit line from a first level to a second level higher than the first level in writing data into a memory cell of the first NAND unit, and changes the voltage potential of the first bit line from the second level to the first level after changing the voltage potential of the first signal from the second level to the first level, the control unit applying a negative voltage to a substrate in writing the data into a memory cell of the second NAND unit after discharging of the first bit line, and the control unit which applies a write voltage to a selected word line, and applies a voltage potential of a third level higher than the second level and lower than the write voltage to an unselected word line after supplying the negative voltage to a substrate.

2. The device according to claim 1, wherein
the first and fourth selection transistors are depletion-type transistors, and the second and third selection transistors are enhancement-type transistors.

3. The device according to claim 1, further comprising:
fifth and sixth selection transistors which connect the first and second NAND units to a source line, wherein the third signal having the second level is supplied to gates of the fifth and sixth selection transistors; and
wherein the control unit sets the gates of a plurality of the memory cells which constitute the first and the second NAND units to the third level higher than the second level and lower than a write voltage after changing the third signal from the third level and the second signal from the second level to the first level, and supplies a write voltage to a gate of a memory cell in which data is to be written.

4. The device according to claim 1, wherein
the control unit changes the first and second signals and the voltage potential of the first bit line from the first level to the second level higher than the first level, and after changing the second signal from the second level to the first level, changes the voltage potential of the first bit line from the second level to the first level.

5. The device according to claim 1, wherein
the control unit applies a negative voltage to a substrate after changing the second signal from the second level to the first level, and before supplying the third level and a write voltage to gates of the memory cells in writing the data into the memory cell of the second NAND unit.

6. The device according to claim 1, wherein
the control unit applies a voltage higher than 0 V to the first bit line in writing the data into the memory cell of the second NAND unit.

7. The device according claim 1, wherein
the control unit applies a voltage higher than 0 V to the first bit line after changing the second signal from the second level to the first level, and before supplying the third level or a write voltage to gates of the memory cells in writing the data into the memory cell of the first NAND unit.

8. The device according to claim 1, further comprising:
a bit line contact which is coupled to the first and the second NAND units, and is coupled to the first bit line.

9. The device according to claim 1, further comprising:
a third NAND unit which is adjacent to the second NAND unit;
fourth NAND unit which is adjacent to the third NAND unit;
fifth and sixth selection transistors which are connected in series between a second bit line and the third NAND unit, wherein the first signal is supplied to the gate of the fifth selection transistor, and the second signal is supplied to the gate of the sixth selection transistor; and
seventh and eighth selection transistors which are connected in series between the second bit line and the fourth NAND unit, wherein the first signal is supplied to the gate of the seventh selection transistor, and the second signal is supplied to the gate of the eighth selection transistor,
wherein the first, fourth, sixth and seventh transistors are depletion-type transistors, and the second, third, fifth and eighth transistors are enhancement-type transistors.

10. The device according to claim 9, wherein
the first, fourth, fifth and eighth selection transistors are enhancement-type transistors, and the second, third, sixth and seventh selection transistors are depletion-type transistors.

11. A semiconductor memory device comprising:
a plurality of NAND units which are arranged in a row direction, and each of the NAND units has a plurality of memory cells connected in series;
a bit line selectively connected to a pair of adjacent NAND units among the plurality of NAND units;
first and second selection transistors connected in series between the bit line and one of the pair of NAND units, wherein a first signal is supplied to the gate of the first selection transistor, a second signal is supplied to the gate of the second selection transistor, and the second selection transistor has a threshold voltage higher than the first selection transistor; and
a control unit which changes a voltage potential of the first and the second signals and a voltage potential of the first bit line from a first level to a second level higher than the first level in writing data into a memory cell of a first NAND unit, and changes the voltage potential of the first bit line from the second level to the first level after changing the voltage potential of the first signal from the second level to the first level, and applies a negative voltage to a substrate after changing the voltage potential of the second signal from the second level to the first level, and before supplying a voltage potential of a third level and a write voltage to gates of the memory cells in writing the data into the memory cell of the first NAND unit.

12. The device according to claim 11, wherein
the first and the fourth selection transistors are depletion-type transistors, and the second and third selection transistors are enhancement transistors.

13. The device according to claim 11, wherein
the control unit applies a voltage higher than 0 V to the bit lines in writing the data into the memory cell of the first NAND unit.

14. A data writing method comprising:
setting a voltage potential of a first signal to a second level higher than a first level, turning on a first depletion-type selection transistor which is connected in series between a bit line and a first NAND unit among the first selection transistor and an enhancement-type second selection transistor, further turning on an enhancement-type third selection transistor which is connected in series between the bit line and a second NAND unit among the third selection transistor and a depletion-type fourth selection transistor, and turning on the voltage potential of the second and the fourth selection transistors by setting a second signal to the second level to charge the first and the second NAND units by a voltage potential of the bit line;
lowering the voltage potential of the bit line after changing the voltage potential of the first signal from the second level to the first level to discharge the first NAND unit through the first and second selection transistors being in on states;
supplying a negative voltage to a substrate after lowering the voltage potential of the bit line; and
supplying a write voltage to a selected word line, supplying a voltage potential of a third level higher than the second level and lower than the write voltage to an unselected word line after supplying the negative voltage to a substrate, and writing data into a selected memory cell of the first NAND unit.

15. The method according to claim 14, further comprising:
applying a voltage higher than 0 V to the bit line in writing the data into the selected memory cell of the first NAND unit.

* * * * *